Oct. 1, 1957 T. W. COOPER 2,808,543

MOUNTING MEANS FOR SEMICONDUCTOR CRYSTAL BODY

Filed Jan. 30, 1956

THEODORE W. COOPER
INVENTOR

BY [signature]

ATTORNEY

United States Patent Office 2,808,543

Patented Oct. 1, 1957

2,808,543

MOUNTING MEANS FOR SEMICONDUCTOR CRYSTAL BODY

Theodore W. Cooper, Torrance, Calif., assignor to Hughes Aircraft Company, Culver City, Calif., a corporation of Delaware Application January 30, 1956, Serial No. 562,280

4 Claims. (Cl. 317—235)

This invention relates to semiconductor signal translating devices and, more particularly, to an improved method for mounting and positioning a semiconductor crystal in an encapsulated semiconductor device, and to such devices.

Semiconductor materials, such as germanium, silicon, germanium-silicon alloys, indium-antimonide, gallium-antimonide, aluminum-antimonide, indium-arsenide, gallium-arsenide, gallium-phosphorus alloys, and indium-phosphorus alloys, and others, have been found to be extremely useful in electrical translating devices.

Basic to the theory of operation of semiconductor devices is the concept that current may be carried in two distinctly different manners, namely "conduction by electrons" or "excess electron conduction" and "conduction by holes" or "deficit electron conduction." The fact that electrical conductivity by both of these processes may occur simultaneously and separately in a semiconductor specimen affords a basis for explaining the electrical behavior of semiconductor devices. One manner in which the conductivity of a semiconductor specimen may be established is by the addition of "active impurities" into the base semiconductor material.

In the semiconductor art, the term "active impurity" is used to denote those impurities which affect the electrical characteristics of a semiconductor material as distinguished from other impurities which have no appreciable effect upon these characteristics. Generally, active impurities are added intentionally to the semiconductor material for producing single crystals for bodies having predetermined electrical characteristics. Active impurities are classified as either donors—such as antimony, arsenic, bismuth, and phosphorus—or as acceptors, such as indium, gallium, thallium, boron, and aluminum. A region of semiconductor material containing an excess of donor impurities and yielding an excess of free electrons is considered to be an impurity doped N-type region. An impurity doped P-type region is one containing an excess of acceptor impurities resulting in a deficit of electrons or, stated differently, an excess of holes.

Semiconductor diodes or transistors utilizing semiconductor crystals of any of the above enumerated materials can be produced with stable electrical characteristics even when a small volume of air is allowed to remain in a package or envelope hermetically sealing the crystal. Point contact semiconductor devices of the type now well known to the art may include a semiconductor crystal and one or more whisker elements in point contact therewith. Among the principal disadvantages of a point contact semiconductor device are the inefficient heat dissipation rate of the device and the relatively low current carrying capacities of the device, both of which are in part caused by the small area of contact between the whisker element and the crystal. It is necessary that point contact devices be operated at relatively low current so as not to exceed their low power dissipation.

When a continuous solid specimen such as a crystal or body of semiconductor material has an N-type region adjacent a P-type region, the boundary between the two regions is termed a P–N or N–P junction. The desirability and advantages of junction, or broad-area, semiconductor devices are apparent and by now well known to those skilled in the art. Among the advantages of semiconductor fused junction devices for some applications are included improvements in such characteristics as lower noise, higher power efficiency, lower operating voltage, greater power handling ability. Through recent advances in the production of P–N junctions, junction type semiconductor devices have become increasingly important in the art.

For example, in the production of a fused junction transistor of the type now well known to the art, the transistor comprises a semiconductor crystal body to which at least three separate ohmic connections are made. Where three connections are used, two are respectively on opposite sides of the semiconductor body and a third is made to a portion of the body intermediate the sides. More specifically, in an N–P–N junction transistor or a P–N–P junction transistor of the type in which the fused junction is formed by the fusion of a pellet of solvent metal containing an active impurity of the type which determines the conductivity type of the regrown crystal region to the surface of the semiconductor crystal, the two connections are made at substantially opposite points on opposed faces of the parent crystal and a third ohmic connection is made at an edge between these faces. Thus, for example, in an N–P–N junction transistor, in which lead-arsenic pellets are fused to opposed surfaces of a P-type germanium crystal to form opposed N-type regions, a first connection is made at one of the N-type regrown crystal regions by ohmically connecting a contact electrode to the lead-arsenic pellet, a second connection is similarly made at the opposed N-type regrown crystal region, and a third connection is made at the surface of the P-type region which separates the two N-type regrown regions. If a relatively low voltage is applied between one opposed connection and the third connection so that a relatively low impedance is encountered and a relatively high voltage is applied between the other opposed connection and the third connection so that a relatively high impedance is encountered, the current introduced into the low impedance is extracted from a high impedance and amplification results. The connection at which the current is introduced is known in the art as the "emitter" and the connection at which the current is extracted is known in the art as the "collector." The third connection is known as the "base" or "base electrode."

A means for hermetically encapsulating transistors which has proven to be particularly advantageous is described and claimed in copending application Serial No. 496,554 for "Semiconductor Transistor Device," by Warren P. Waters and Richard A. Gudmundsen, filed March 24, 1955, and assigned to the assignee of the present application, in which the semiconductor transistor body is mounted upon a heat conducting diaphragm which is, in turn, positioned and affixed between two mating body portions which form the hermetically sealed encapsulating envelope. Although the method of mounting the semiconductor body upon a diaphragm and the encapsulating means disclosed in the above copending application have provided excellent results, it has been found that, under certain operational conditions, stresses and vibrations upon the envelope are transmitted to the mounting diaphragm in such a way that strains are introduced at the contact area between the diaphragm and the semiconductor transistor body. These stresses and strains may be sufficiently severe to cause the semiconductor transistor body to be loosened from the diaphragm and in some instances stresses are sufficiently severe to cause fracture of the semiconductor transistor body.

Accordingly, it is an object of the present invention to provide an improved mounting means for the semiconductor crystal body in encapsulated semiconductor devices.

It is another object of the present invention to provide a diaphragm upon which the semiconductor crystal body is mounted in an encapsulated semiconductor device which isolates the semiconductor crystal body from shocks and stresses applied to the encapsulating means.

It is still another object of the present invention to provide a mounting means for the semiconductor crystal body in an encapsulated semiconductor device which isolates the semiconductor crystal body from severe stresses and strains while maintaining a good thermal and electrical conducting path from the crystal body to the encapsulating envelope.

It is a further object of the present invention to provide a diaphragm upon which the semiconductor crystal body is mounted in an encapsulated semiconductor device which absorbs deformation encountered in the assembly of the device.

It is still a further object of the present invention to provide a means for mounting a semiconductor crystal body in an encapsulated semiconductor device which allows electrical connections to be made to the semiconductor crystal body with greater production ease than has heretofore been possible in the prior state of the art.

The present invention comprises, in combination with an encapsulated semiconductor device, a semiconductor crystal body mounting diaphragm having a disc shaped configuration with a region of reduced thickness surrounding the central region of the disc.

The novel features which are believed to be characteristic of the invention, both as to its organization and method of operation, together with further objects and advantages thereof, will be better understood from the following description considered in connection with the accompanying drawing, in which three embodiments of the invention are illustrated by way of example. It is to be expressly understood, however, that the drawing is for the purpose of illustration and description only, and is not intended as a definition of the limits of the invention.

Figures 1, 2:
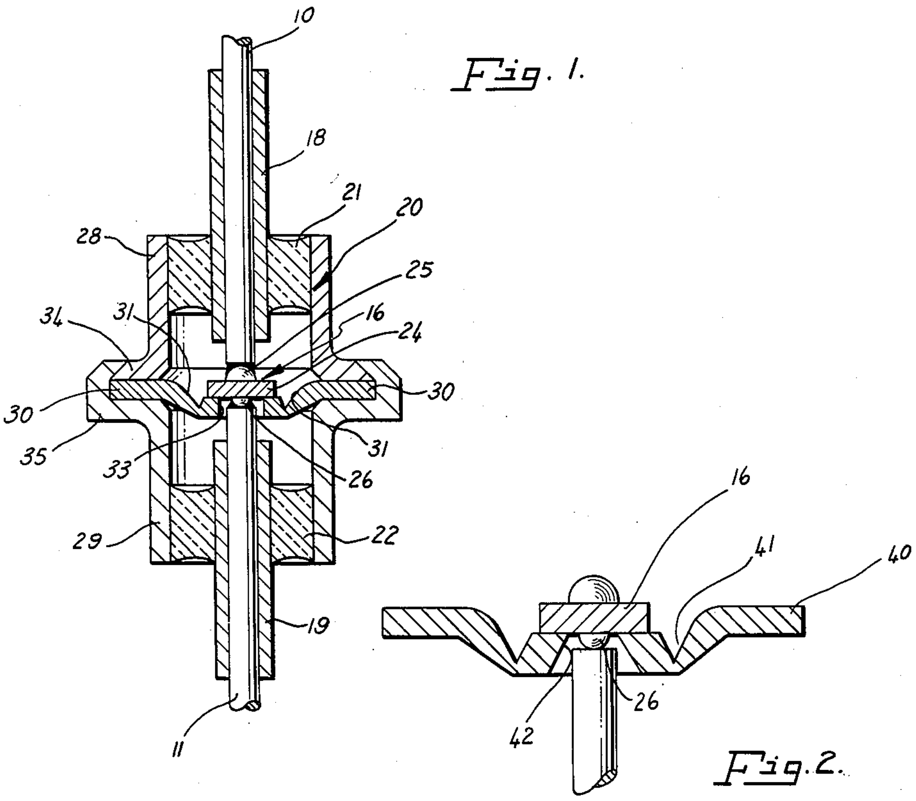
Fig. 1 is a sectional view of an illustrative junction-type transistor in which the semiconductor transistor body is mounted upon a mounting diaphragm constructed in accordance with the present invention.
Fig. 2 is an alternative embodiment of the mounting diaphragm of the present invention, shown not to scale for purposes of clarity.

Referring now to the drawing, Fig. 1 shows a fused junction transistor of the type known to the art which is illustrative of the semiconductor devices in which the present invention may be advantageously utilized. For purposes of illustration, an N–P–N junction transistor of the type disclosed and claimed in the copending application of Waters and Gudmundsen, supra, in which germanium is utilized as the semiconductor body will be described to show the utility and operation of the present invention. In addition, the ohmic connections to the semiconductor transistor body are formed in accordance with the copending application Serial No. 550,317, for "Junction Type Semiconductor Devices and Method of Making the Same," by Theodore W. Cooper, filed December 1, 1955, and assigned to the assignee of the present application. It will be recognized, however, that the mounting diaphragm and the operational steps of assembly to be described may be employed to mount the semiconductor crystal body in P–N–P or N–P–N junction transistors, P–N–P or N–P–N point contact transistors, and semiconductor diodes in which germanium, silicon, or intermetallic semiconductors are used as the semiconductor body.

Referring now to Fig. 1, the present invention is a semiconductor crystal body mounting diaphragm in combination with an encapsulated semiconductor device of the type known to the prior art. A first contact electrode 10 and a second contact electrode 11 are positioned in ohmic contact with a first lead arsenic pellet 25 and second lead-arsenic pellet 26 which define the opposed N-type regions of an N–P–N semiconductor transistor body. Tubular members 18, 19 extend from an encapsulating envelope 20 and are positioned with an open end of the respective tubular members proximate opposed lead-arsenic pellets which define the N-type regions of the N–P–N semiconductor transistor body 16 to which the ohmic connections are made. Sintered glass beads 21, 22 are positioned between the tubular members 18, 19 and the inner wall of the encapsulating envelope 20 in such a manner that the tubular members are mechanically affixed to the encapsulating envelope but are electrically insulated therefrom. The first electrode 10 and the second electrode 11 having an outside diameter substantially equal to, but less than, the inside diameter of the tubular members 18, 19 are positioned within the respective tubular members. The space between the electrodes and respective tubular members is filled with a quantity of solder which mechanically affixes the electrodes and tubular members and furnishes a hermetic seal for the encapsulating means.

In the illustrative embodiment of the invention as shown in Fig. 1, the transistor body 16 provides a fused junction N–P–N transistor having a P-type germanium crystal body 24 with N-type fused junction regions on opposed surfaces thereof. In this illustrative transistor, the semiconductor transistor body is formed by fusing a lead-arsenic emitter pellet 26 to one surface of the P-type germanium wafer 24 which is of the order of ⅛" on a side and 12 mils in thickness. The emitter pellet 26 is approximately 20 mils in diameter and is fused to the surface of the germanium body 24 by methods well known to the art. The collector pellet 25, which is also a lead-arsenic pellet and is approximately 40 mils in diameter is similarly fused to the opposed surface of the germanium body 24 to form the collector P–N junction. The P-type base region between the emitter and collector junctions is then approximately 1.5 mils in thickness. After fusion it will be noted that the collector junction has a larger area than the emitter junction which is generally desirable.

The semi-conductor crystal body is hermetically encapsulated as disclosed in the copending application to R. A. Gudmundsen and W. Waters, supra, by affixing the semiconductor transistor body 16 to the semiconductor body mounting diaphragm 30 constructed in accordance with the present invention. The mounting diaphragm 30 is a dish-shaped disc of electrically and thermally conductive material which defines an opening 33 symmetrical about the centerline having a diameter substantially less than the width of the transistor body 16 but greater than the diameter of the lead-arsenic pellet 26 on the surface of the germanium crystal body which is to be the contact surface of the germanium crystal body with the mounting diaphragm 30. The thickness of the mounting diaphragm is substantially reduced along a diameter substantially greater than the diameter of the opening.

Figure 3:
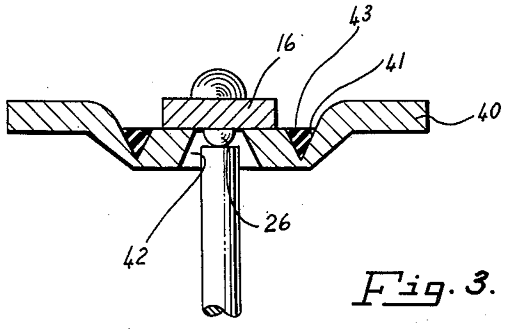
Fig. 3 is another alternative embodiment of the mounting diaphragm constructed in accordance with the present invention.

For example, in the presently perferred embodiment, the mounting diaphragm 30 is a dish-shaped disc of cold rolled steel having a thickness of the order of 20 mils and an outside diameter of approximately 0.280". The diaphragm defines an opening symmetrical about the centerline which is approximately 40 mils in diameter. A depression is formed in the diaphragm forming a circular region 31 of reduced thickness which is substantially conical in cross-sectional configuration, as shown in Figs. 1, 2, and 3. The minimum thickness of the diaphragm, that is, at the apex of the conical depression is of the order of 8 mils and is at a radius of about 90 mils. In the present embodiment, the diaphragm is formed by a punch press operation although many methods of forming will be apparent to those skilled in the art. Although a dish-shaped disc is utilized in this embodiment, and is preferable, a planar disc having an opening therethrough and a region of reduced thickness surrounding the opening may also be used.

In accordance with Waters and Gudmundsen, supra, gold paste, solder, or other thermally conductive material is used to affix the transistor body 16 to the diaphragm 30 such that the center lines of the emitter and collector junctions are substantially coincident with the longitudinal center line of the diaphragm. The encapsulating package 20 for the transistor comprises a first body portion 28 and a second body portion 29 which are hollow cylinders of thermally conductive material having open ends and an outwardly directed right angle flange 34, 35 at one end thereof. The flange 34 of the first body portion 28 is substantially equal in outside diameter to the outside diameter of the diaphragm 30. However, the flange 35 of the second body portion 29 is substantially greater in outside diameter than the flange of the first body portion by an amount sufficient to allow crimping of the second flange 35 over the diaphragm 30 and the first flange 34 as shown. The diaphragm 30 and the first and second body portions 28, 29 may be formed of cold rolled steel.

Although the semiconductor body mounting diaphragm 30 of the present invention is not limited to the encapsulating means described, such encapsulating means have given excellent results in combination with the present invention. Although the contact electrodes 10, 11 in an encapsulated semiconductor transistor of the type shown in Fig. 1 may be mounted and positioned in the encapsulating device by methods known to the art, the methods of mounting and positioning the electrodes disclosed in the copending application to Cooper, supra, has been found to be particularly advantageous. Accordingly, the production of such a semiconductor transistor device utilizing the contact electrode mounting method disclosed in Cooper, supra, together with the encapsulating means described and claimed in Waters and Gudmundsen, supra, will be described as illustrative in connection with the utilization of a semiconductor crystal body mounting diaphragm in accordance with the present invention.

The electrodes 10, 11 are inserted into the tubular members 18, 19 after being pretinned in order to furnish the necessary amount of solder to fill the body between the outside surface of the electrode and the inside surface of the tubular member. The first tubular member 18 and the second tubular member 19 are positioned proximate the respective emitter and collector areas to which the ohmic connections are to be made by extending the tubular members 18, 19 through the encapsulation means while electrically insulating them therefrom. In this embodiment, the tubular members 18, 19 are formed of iron-nickel alloy and are of the order of 0.06" in outside diameter with an inside diameter of the order of 0.3". For production purposes it has been found advantageous to affix and seal the tubular members within the body portions by using a sintered glass insulative bond in the form of glass beads 21, 22 surrounding each member which is formed under high pressure to effect the insulative seal. In the production of a transistor the first and second tubular members 18, 19 are insulatively affixed and sealed within the first and second body portions 28, 29, respectively, with the first and second contact electrodes 10, 11 positioned in the respective tubular members. The space between the inside surface of the tubular members and the outside surface of the contact electrodes is filled with solder.

The semiconductor transistor body 16 is mounted upon the mounting diaphragm 30 such that the lead-arsenic pellet 26 defining the emitter region of the semiconductor transistor body extends beneath the upper surface of the mounting diaphragm into the opening 33 through the diaphragm, but is not in contact with the diaphragm. With the semiconductor crystal body affixed to the mounting diaphragm, the first and second body portions 28, 29 of the envelope are mated with the mounting diaphragm 30 positioned between the flanges, and the device is assembled and sealed by crimping the flange 35 over the flange 34 and the diaphragm 30. The flanges are mated and joined in such a way that a hermetic seal is obtained between the respective body portions.

The assembly of the transistor device is then completed and an ohmic contact is obtained at the collector and emitter junctions by heating the tubular members 18, 19, and the contact electrodes 10, 11 to a temperature above the melting point of the solder. After the solder becomes molten, the contact electrodes are advanced to the position at which electrical contact is obtained between the contact electrodes and the emitter 26 and collector 25 pellets, respectively. After ohmic connection has been determined electrically, the contact electrodes are further advanced a predetermined amount to provide a relatively large area of ohmic contact between the electrodes and the lead oxide pellets, and the final seal of the device is formed. Thus, in use, shocks and stresses upon the encapsulating envelope are isolated from the area of the semiconductor crystal body since stresses are relieved and shocks absorbed in the region of reduced thickness of the diaphragm where deformation may most easily occur.

Referring now to Fig. 2, an alternative embodiment of the mounting diaphragm of the present invention is shown. A circular depression 41 similar to that shown and described in connection with Fig. 1 is formed in the mounting diaphragm 40 which defines an opening 42 through the diaphragm symmetrically about the longitudinal centerline of the diaphragm 40. The opening 42 through the diaphragm is frusto-conical in configuration. The frusto-conical opening 42 has its major diameter at the surface of the diaphragm opposed to the surface upon which the semiconductor crystal body 16 is mounted. Thus, in the case of a transistor in which it is desirable to have the region of contact extend as close as possible to the lead-arsenic emitter pellet 26 and thus the N-type region for purposes of reducing base resistance and increasing thermal conduction, it still remains possible to make the ohmic connection to the emitter pellet with relative ease.

Referring now to Fig. 3, when the amount of heat to be conducted away from the crystal body is sufficiently great that the decreased thickness of the diaphragm causes a heat conduction problem, it is found to be advantageous to fill the depression 41 with a malleable metal 43 which is thermally conductive. Thus, deformation of the diaphragm and isolation of the semiconductor crystal body from excessive stresses and shocks is still provided although the heat conduction path has not been reduced.

Thus, the present invention provides a means for mounting a semiconductor crystal body in an encapsulated semiconductor device which isolates the region of the diaphragm upon which the semiconductor crystal body is mounted from excessive stresses, shocks, and strains to which the encapsulating envelope may be subjected.

What is claimed is:

1. In an encapsulated semiconductor device, means for mounting and positioning a semiconductor crystal body comprising: a disc-shaped diaphragm, said diaphragm being electrically and thermally conductive, said diaphragm defining an opening therethrough substantially symmetrical about the axis of said diaphragm, said opening having an area substantially less than a contact surface of said semiconductor crystal body, said diaphragm defining a region of reduced thickness surrounding said opening; said semiconductor crystal body being ohmically affixed to said diaphragm symmetrical with respect to said axis.

2. In an encapsulated semiconductor device, means for mounting and positioning a semiconductor crystal body comprising: a diaphragm, said diaphragm being a dish-shaped disc of thermally conductive material, said diaphragm defining an opening therethrough symmetrical about the axis of said diaphragm, said opening having an area substantially less than a contact surface of said semiconductor crystal body, said diaphragm defining a region of reduced thickness surrounding said opening at a diameter substantially greater than the diameter of said opening; said semiconductor crystal body being ohmically affixed to said diaphragm symmetrical with respect to said axis.

3. In an encapsulated semiconductor device, means for mounting and positioning a semiconductor crystal body comprising: a semiconductor crystal body mounting diaphragm, said diaphragm being a dish-shaped disc of electrically and thermally conductive material, said diaphragm defining a circular opening therethrough symmetrical about the axis of said diaphragm, said opening having an area substantially less than a contact surface of said semiconductor crystal body, said diaphragm defining a region of reduced thickness surrounding said opening at a diameter substantially greater than the diameter of said opening, said region of reduced thickness being provided by a groove having a substantial depth; said semiconductor crystal body being ohmically affixed to said diaphragm symmetrically with respect to said axis.

4. In an encapsulated semiconductor transistor device, means for mounting and positioning a semiconductor transistor body having P–N junctions at first and second opposed surfaces thereof, comprising: a transistor body mounting diaphragm, said diaphragm being a dish-shaped disc of electrically and thermally conductive material, said diaphragm defining an opening therethrough symmetrical about the axis of said diaphragm, said opening having an area substantially less than the area of said first surface of said transistor body and greater than the P–N junction region at said first surface; said diaphragm defining a region of reduced thickness surrounding said opening at a diameter substantially greater than the diameter of said opening, said region of reduced thickness being a groove having a substantial depth; said transistor body being ohmically affixed to said diaphragm symmetrical with respect to said axis within the area enclosed by said groove, whereby said transistor body is isolated from shocks and stresses transmitted to said diaphragm.

References Cited in the file of this patent

UNITED STATES PATENTS

| | | |
|---|---|---|
| 2,754,455 | Pankove | July 10, 1956 |
| 2,794,942 | Cooper | June 4, 1957 |